United States Patent
Jang

(10) Patent No.: US 7,129,108 B2
(45) Date of Patent: Oct. 31, 2006

(54) CMOS IMAGE SENSOR AND MANUFACTURING METHOD THEREOF

(75) Inventor: Hoon Jang, Cheongju (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/956,202

(22) Filed: Sep. 30, 2004

(65) Prior Publication Data

US 2005/0082627 A1    Apr. 21, 2005

(30) Foreign Application Priority Data

Oct. 1, 2003  (KR)  ................. 10-2003-0068493

(51) Int. Cl.
   *H01L 29/72*   (2006.01)
(52) U.S. Cl. ................... 438/70; 257/225; 438/73
(58) Field of Classification Search ............. 257/225; 438/70
   See application file for complete search history.

(56) References Cited

U.S. PATENT DOCUMENTS

| | | | |
|---|---|---|---|
| 4,600,833 A | 7/1986 | Shibata et al. | |
| 5,719,074 A | 2/1998 | Hawkins et al. | |
| 5,841,126 A | 11/1998 | Fossum et al. | |
| 5,886,659 A | 3/1999 | Pain et al. | |
| 5,990,506 A | 11/1999 | Fossum et al. | |
| 6,005,619 A | 12/1999 | Fossum | |
| 6,021,172 A | 2/2000 | Fossum et al. | |
| 6,852,565 B1 * | 2/2005 | Zhao | ............. 438/73 |
| 2003/0071271 A1 * | 4/2003 | Suzuki et al. | ............. 257/98 |

FOREIGN PATENT DOCUMENTS

JP    2-3968    1/1990

OTHER PUBLICATIONS

Satoshi Uchiya; Manufacture of Solid-State Colored Image Sensing Element; Patent Abstracts of Japan; Publication No. 02-003968; Publication Date Jan. 9, 1990; 1 Pg.; Japan Patent Office; 1998, 2003.

* cited by examiner

*Primary Examiner*—Edward Wojciechowicz
(74) *Attorney, Agent, or Firm*—Andrew D. Fortney

(57) ABSTRACT

A CMOS image sensor according to the present invention includes a substrate having a light receiving region, an interlayer insulating film formed on the substrate, a plurality of metal wirings formed on the interlayer insulating film so as to expose the light receiving region, a protection layer coated on the metal wirings and the interlayer insulating film, and a plurality of color filters formed on the protection layer, wherein at least one of the color filters is provided with an isolation layer formed on an upper surface thereof.

20 Claims, 5 Drawing Sheets

CMOS IMAGE SENSOR AND MANUFACTURING METHOD THEREOF

BACKGROUND OF THE INVENTION (a) Field of the Invention

The present invention relates to a CMOS image sensor and a manufacturing method thereof.

(b) Description of the Related Art

An image sensor is a semiconductor device converting optical images into electrical signals and, typically manufactured in a type of a charge coupled device (CCD) or a complementary metal oxide semiconductor (CMOS) image sensor.

The charge coupled device is an integrated circuit containing an array coupled capacitors. Each capacitor stores and transfers electric charge to on or other of its neighbors. In the meantime, the CMOS image sensor is a device adopted a switching mechanism sequentially detecting output using MOS transistors as many as the number of pixels with the CMOS technology which uses the control circuit and signal processing circuit as peripheral devices.

The CMOS image sensor is comprised of a photo-sensing region for detecting the light, a logic circuit area for processing to convert the light into electric signals, and color filters arranged over the photo-sensing region. The photo-sensing region generates photoelectric charges using the light from outside and accumulates the charges. The color filter array (CFA) includes the three filter elements of red, green, and blue colors or yellow, magenta, and cyan colors.

In this case, the red, green, and blue colors filters are formed by exposing and developing the red, green, and blue photo resists formed on the photosensing region. Unlike other processes, however, the photo resist pattern becomes the color filter by itself through the process for forming the color filters, such that when the three photo resist patterns should be formed it is required to rework for forming any of three colors filters, the previously formed photo resist pattern(s) as well as the current photo resist must be removed.

Also, since the color filter-forming processes should be carried out three times or more while the metal on the pad part is exposed such that the metal is likely to be eroded by the developer solution. The damage of the metal pad causes various problems in wire bonding and probe test processes.

The U.S. Pat. Nos. 5,719,074 and 4,600,833 have disclosed typical image sensors and methods for manufacturing the image sensors.

SUMMARY OF THE INVENTION

The present invention has been made in an effort to solve the above problems, and it is an object of the present invention to provide a CMOS image sensor which is capable of protecting the previously formed color filter during the color filter formation rework, by forming isolation layer(s) between the color filters.

It is another object of the present invention to provide a CMOS image sensor and a manufacturing method thereof which is capable of avoiding the damage of the metal of pad part.

The CMOS image sensor according to the present invention includes a substrate, an interlayer insulating film formed on the substrate, a plurality of metal wirings formed on the interlayer insulating film so as to exposed the light receiving region, a protection layer covering the metal wirings and the interlayer insulating film, a plurality of color filters formed on the protection layer, and at least one isolation layer formed, respectively, on the color filters.

Also, the isolation layer is any of silicon oxide layer, silicon nitride layer, TEOS, silicon oxide layer, and silicon oxide nitride layer.

Also, the isolation layer is preferably formed at a thickness in the range from 50 to 3000 Å.

In another aspect of the present, the method for manufacturing the CMOS image sensor includes forming an interlayer insulating film on a substrate having a light receiving region, forming a plurality of metal wirings so as to expose the light receiving region on the interlayer insulating film between the metal wirings, forming a protection layer on the metal wirings and the interlayer insulating film, and forming a plurality of color filters on the protection layer, wherein at least one isolation layer being formed at least one of the color filters.

Preferably, the step of forming the color filters and the isolation layer includes forming a first color filter on the protection layer, forming a first isolation layer on the first color filter and the protection layer, forming a second color filter on the first isolation layer, forming a second isolation layer on the second color filter and the first isolation layer, forming a third color filter on the second isolation layer, and forming a third isolation layer on the third color filter.

Preferably, pad parts of the metal wirings are formed after forming the third isolation layer.

Preferably, the first to third isolation layers are formed by a chemical vapor deposition technique or spin coating technique.

Preferably, the step of forming the color filters and the isolation layers includes forming a first color filter on the protection layer, forming a first isolation layer on the first color filter and the protection layer, forming a second color filter on the first isolation layer, forming a third color filter on the first isolation layer, and forming a second isolation layer on the second color filter, third color filter, and the first isolation layer.

DETAILED DESCRIPTION OF THE PREFERRED EMBODIMENTS

Figure 1:
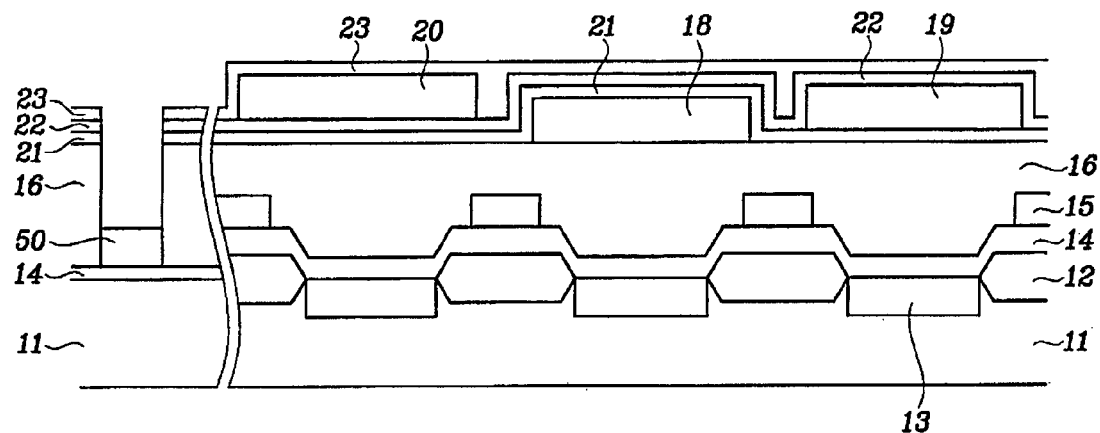
FIG. 1 is a cross-sectional view illustrating a CMOS image sensor according to a first embodiment of the present invention.

The details of the present invention will be described hereinafter with reference to the accompanying drawings, in which preferred embodiments of the invention are shown. The present invention may, however, be embodied in many different forms and should not be construed as limited to the embodiments set forth herein.

In the drawings, the thickness of layers, films and regions are exaggerated for clarity. Like numerals refer to like elements throughout. It will be understood that when an element such as a layer, film, region or substrate is referred to as being "on" another element, it can be directly on the other element or intervening elements may also be present. In contrast, when an element is referred to as being "directly on" another element, there are no intervening elements present.

A CMOS image sensor and a manufacturing method thereof according to a preferred embodiment of the present invention will be described hereinafter with reference to the accompanying drawings in detail.

FIG. 1 is a cross-section view illustrating a CMOS image sensor according to a first embodiment of the present invention Referring to FIG. 1, the CMOS image sensor according to the first embodiment of the present invention includes a field oxide layer 12 formed on a semiconductor substrate 11 for electrically isolating the devices from each other. On the semiconductor substrate 11, a gate electrode (not shown) of a transistor, made by depositing polysilicon and tungsten silicide, is formed.

And, a light receiving area comprised of photodiodes 13 is formed in the semiconductor substrate 11 and a source and a drain of the transistor and a sensing node (not shown) are formed by ion implanting.

Also, on the semiconductor substrate 11, an interlayer insulating film 14 and metal wiring 15 are sequentially formed, and a pad part 50 is formed with the metal wiring from the same layer, the metal wiring being connected to an exterior circuit. A protection layer 16 is formed on the metal wiring 15 and the pad part 50.

And, three color filters, i.e. red filter 18, green filter 19, and blue filter 20, for implementing color image are formed on the protection layer 16. The three color filters are 18, 19, and 20 are typically formed using dyed photo resists.

That is, as shown in FIG. 1, the blue color filter 18 is formed on the protection layer 16, and a first isolation layer 21 is formed on the blue color filter 18 and the protection layer 16. The red color filter 19 is formed on the first isolation layer 21 on which the blue color filter 18 is not formed, and the second isolation layer 22 is formed on the red color filter 19 and the first isolation layer 21. The green color filter 20 is formed on the second isolation layer 22 on which the blue color filter 18 and the red color filter are not formed. And a third isolation layer 23 is formed on the green color filter 20 and the second dielectric filter 22. Each of the first to third isolation layers is any of thermal silicon oxide, silicon nitride, TEOS, silicon oxide layer, silicon oxide nitride layer.

Since the isolation layers 21, 22, and 23 are formed between the color filters, it is possible to perform the color filter formation rework without removing other color filter(s). For example, when it is required to perform the green filter rework, the green filter rework process can be performed without removing the blue and red color filters that are protected by the second isolation layer.

In FIG. 1, the blue color filter 18, the red color filter 19, and the green color filter 20 are deposited in sequential order, however, the color filters can be deposited in different orders.

A method for manufacturing the CMOS image sensor according to a first embodiment of the present invention will be described hereinafter with reference to FIG. 2 to FIG. 8 in detail.

FIG. 2 to FIG. 8 are cross-sectional views illustrating fabricating steps of the CMOS image sensor according to the first embodiment of the present invention.

Figure 2:
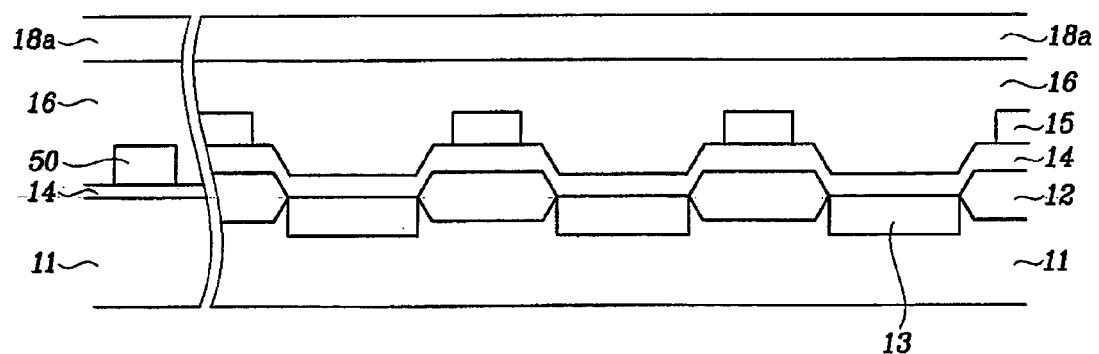
FIG. 2 to FIG. 8 are cross-sectional view illustrating manufacturing steps of the CMOS image sensor according to the first embodiment of the present invention.

Referring to FIG. 2, in the manufacturing method of the CMOS image sensor according to the first embodiment of the present invention, firstly, a field oxide layer 12 is formed on the semiconductor substrate for isolating devices from each other and then a gate electrode (not shown) of a transistor is formed by depositing polysilicon and tungsten silicide on the semiconductor substrate.

Next, a light receiving region comprised of photodiodes is formed in the semiconductor substrate 11 through impurity ion implant process, and then a source and drain and a sensing node (not shown) are formed by ion implantation.

Next, the interlayer insulating film 14 and the metal wiring 15 are formed in sequential order on the semiconductor substrate, and the pad part 50 is preferably formed so as to connect to the exterior circuit. And then the protection layer 16 is formed on the metal wiring 15. In case of using a plurality of metal wirings, inter metaldielectric (IMD) is formed between the metal wiring and the first protection layer is formed on the final metal wiring even though a single metal wiring is illustrated in FIG. 2.

Figure 3:
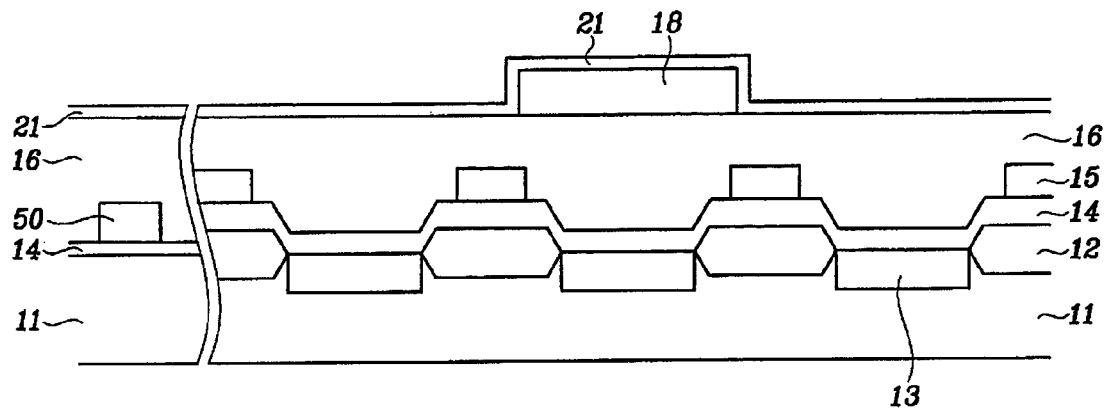

Next, as shown in FIG. 2, a blue photo resist 18a is formed on the protection layer 16. And, as shown in FIG. 3, the blue photo resist 18a is exposed and developed so as to be formed as the blue color filter, and then the first transparent isolation layer 21 is formed on the blue color filter and the protection layer 16.

Preferably, the first isolation layer 21 is one of thermal oxide layer, silicon nitride layer, TEOS, silicon oxide layer and silicon oxide nitride layer.

And the first isolation layer 21 is formed at a thickness in the range of 50~3000 Å, particularly at 1000 Å using the chemical vapor deposition or the spin coating technique.

Figure 4:
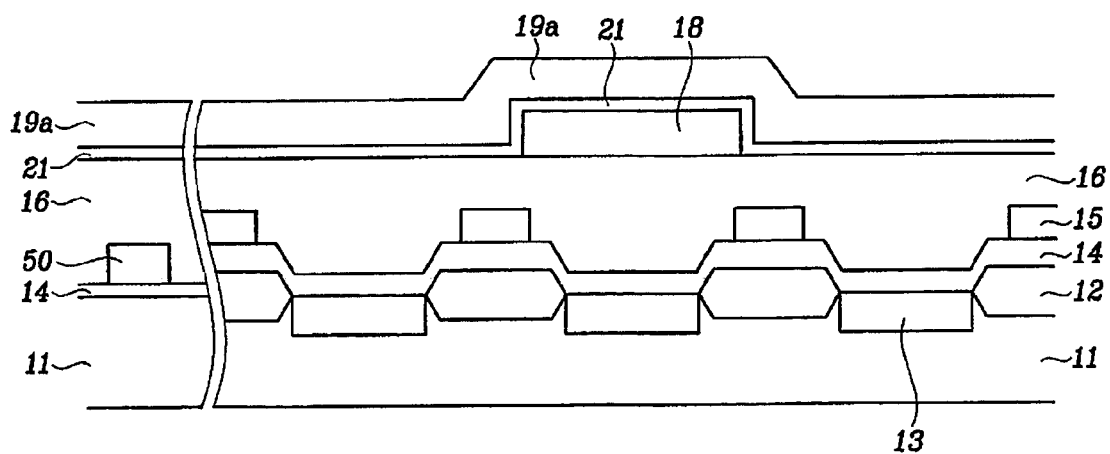
Figure 5:
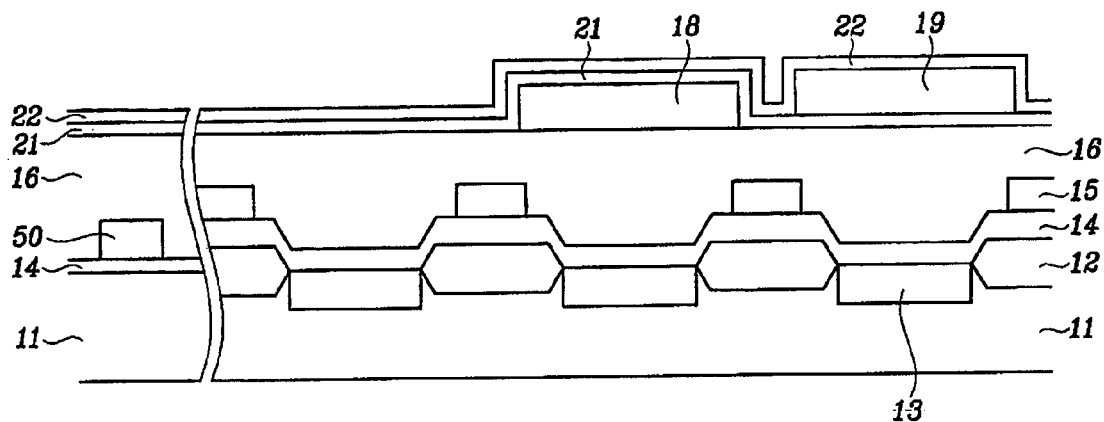

Next, as shown in FIG. 4, the red photo resist 19a is formed on the first isolation layer 21. And as shown in FIG. 5, the red photo resist 19a is exposed and developed so as to be formed as the red color filter 19, and the second transparent isolation layer 22 is formed on the red color filter 19 and the first isolation layer 21.

Preferably, the second isolation layer 22 is one of thermal oxide layer, silicon nitride layer, TEOS, silicon oxide layer and silicon oxide nitride layer.

And the second isolation layer 22 is formed at a thickness in the range of 50~3000 Å, particularly at 1000 Å using the chemical vapor deposition or the spin coating technique.

Figure 6:
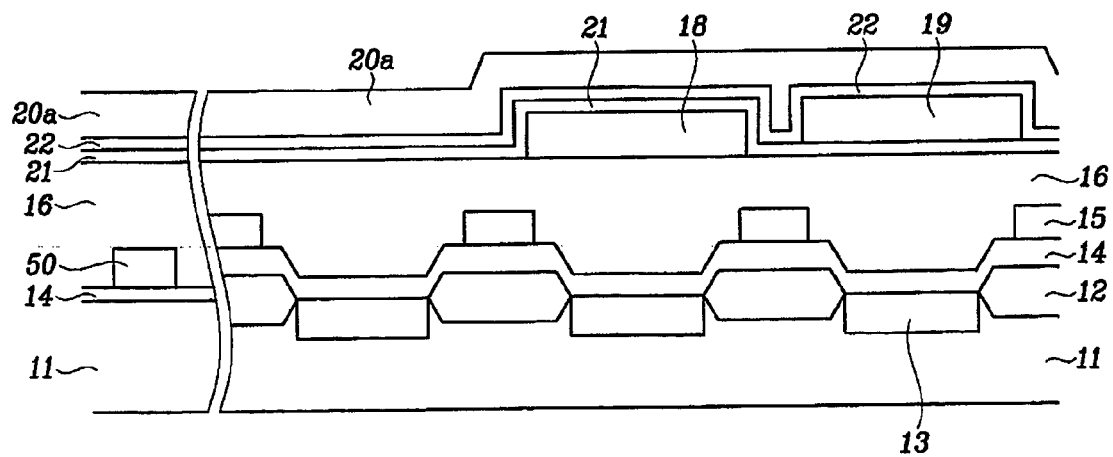
Figure 7:
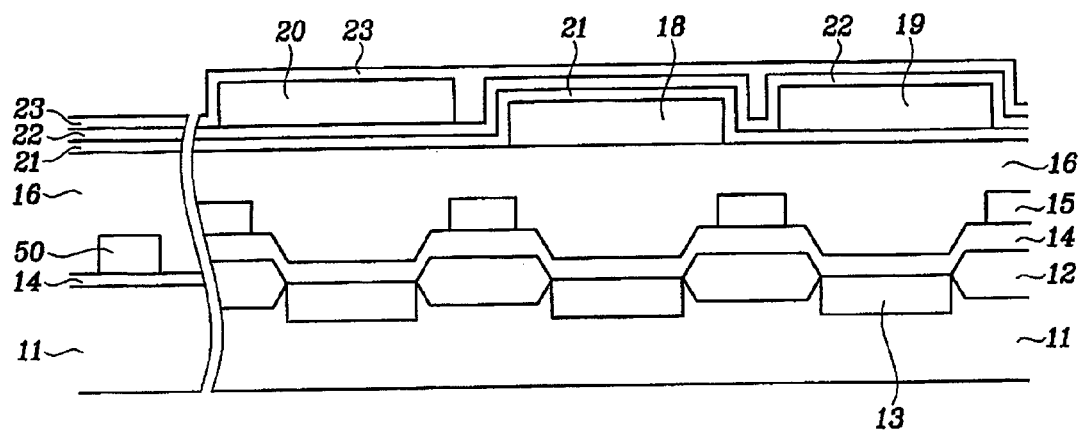

Next, as shown in FIG. 6, the green photo resist 20a is formed on the second isolation layer 22. And, as shown in FIG. 7, the green photo resist 20a is exposed and developed so as to be formed as the green color filter 20, and the third transparent isolation layer 23 is formed on the green color filter 20 and the second isolation layer 22.

Preferably, such a third isolation layer 23 is one of thermal oxide layer, silicon nitride layer, TEOS, silicon oxide layer and silicon oxide nitride layer.

And the second isolation layer 22 is formed at a thickness in the range of 50~3000 Å, particularly at 1000 Å using the chemical vapor deposition or the spin coating technique.

Figure 9:
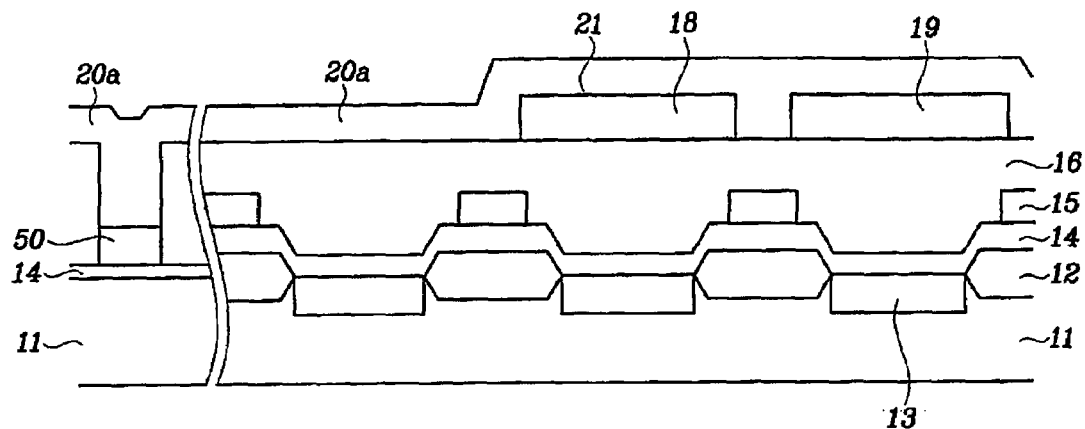
FIG. 9 is a cross-sectional view illustrating a manufacturing step of a conventional CMOS image sensor in which a green filter is formed by depositing a green photo resist after blue and red color filters are formed.

In the conventional case as shown in FIG. 9, when the green color filter 20 is formed by depositing the green photo resist 20a after the blue color filter 18 and the red color filter 19 are formed and a deposition defect or an exposure fault occurs so as to be required to remove the green photo resist 20a for deposition rework, the previously formed blue and red filters 18 and 19 should be removed together with the green photo resist since there is no isolation layer which is applied to the first embodiment of the present invention. Accordingly, the rework should be performed from the initial blue color filter formation process. That is, in order to forming a single color filter in rework process, the previously formed color filters should be removed.

In the first embodiment of the present invention, however, the isolation layers 21, 22, and 23 are formed between the respective color filters such that it is possible to perform the green color filter formation rework without removing the blue and red color filters 18 and 19 since the blue and red color filters 18 and 19 are protected by the second isolation layer 22.

Figure 8:
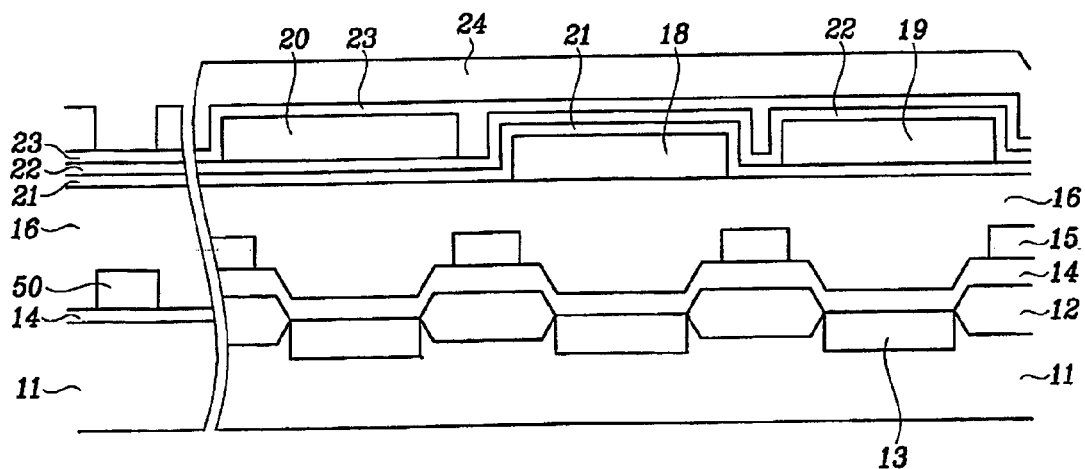

After forming the third isolation layer, a pad photo resist is formed on the third isolation layer as shown in FIG. 8. And the pad photo resist is exposed and developed so as to be formed as a pad pattern 24.

Next, as shown in FIG. 1, the isolation layers 21, 22, and 23 and the protection layer 16 are etched using the pad pattern 24 as a mask so as to expose the pad part 50. And then the pad pattern 24 is removed by ashing technique.

In the conventional method in FIG. 9, the color filter is formed after the pad part 50 is formed such that the pad part 50 is likely to be eroded by the developer solution and the erosion damage can be deteriorated when the rework is required.

However, in the first embodiment of the present invention the pad part 50 is protected by the first to third isolation layers 21, 22, and 23 and the pad part 50 is exposed after the color filters are completely formed such that the pad part 50 and the color filters 18, 19, and 20 can be protected during the etching process for exposing the pad part 50 and the ashing process for removing the pad photo resist.

In the first embodiment of the present invention, the isolation layer is formed between all the color filters, however, it is possible to form a single isolation layer on any of the color filters.

Figure 10:
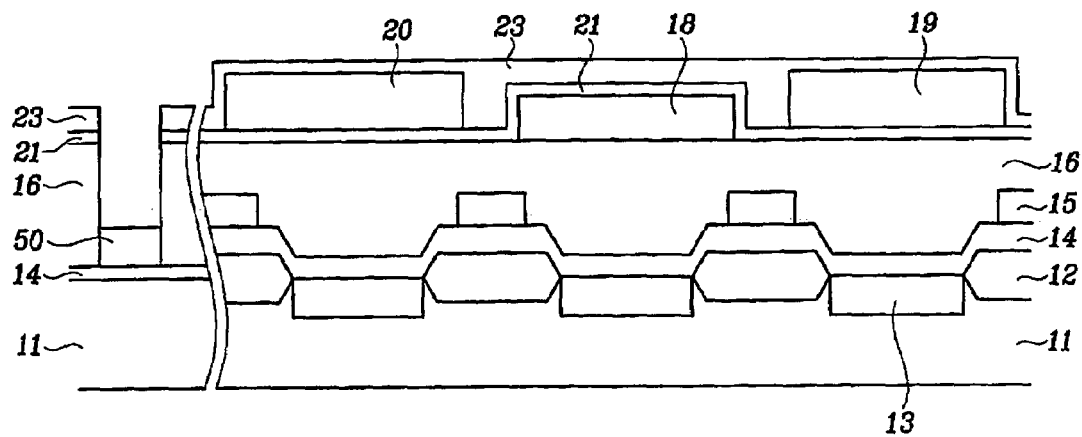
FIG. 10 is a cross-sectional view illustrating a CMOS image sensor according to a second embodiment of the present invention.

FIG. 10 is a cross-sectional view illustrating a CMOS image sensor according two a second embodiment of the present invention. Here, the identical reference numerals refer to the similar functions and members in the previous drawings.

As shown in FIG. 10, the blue filter 18 is formed on the protection layer 16, and the first isolation layer 21 is formed on the blue color filter 18 and the protection layer 16. Also, the red filter 19 and the green filter 20 are formed on the first isolation layer 21 so as not to be overlapped with the blue color filter 18 and from each other. In this manner, the process can be simplified by skipping the second isolation layer formation process. Also, by canceling the formation of the second isolation layer which is formed by depositing the thermal oxide layer, it is possible to minimize the performance degradation of the image sensor caused by the heat generated during the thermal oxide layer formation process.

Also, the third isolation layer 23 is formed on the red and green color filters 19 and 20 and the first isolation layer 21. In such manner, the isolation layers 21 and 23 are formed between the color filters such that even when the rework is required for any of color filters formation processes, for example the red filter formation process, is required, there is no need to remove the blue color filter 18 which is protected by the first isolation layer 21.

In FIG. 10, the blue color filter 18, the red color filter 19, and the green color filter 20 are deposited in sequential order, however, the deposition order can be changed.

Although preferred embodiments of the present invention have been described in detail hereinabove, it should be clearly understood that many variations and/or modifications of the basic invention concepts here taught which may appear to those skilled in the present art will still fall within the spirit and scope of the present invention, as defined in the appended claims.

In the CMOS image sensor and the manufacturing method thereof, the isolation layers are provided between the color filters such that it is possible to protect the previously formed color filter(s) during the rework process.

Also, in the CMOS image sensor-manufacturing method, the pad part metal is exposed after forming the color filters, it is possible to prevent the pad part from being damaged.

What is claimed is:

1. A method for manufacturing a CMOS image sensor comprising:
   forming an interlayer insulating film on a substrate having a light receiving region;
   forming a plurality of metal wirings so as to expose the light receiving region on the interlayer insulating film between the metal wirings;
   forming a protection layer on the metal wirings and the interlayer insulating film;
   forming a first color filter on the protection layer;
   forming a first isolation layer on the first color filter and the protection layer; and
   forming a second color filter on the first isolation layer;
   forming a second isolation layer on the second color filter and the first isolation layer;
   forming a third color filter on the second isolation layer; and
   forming a third isolation layer on the third color filter.

2. The method of claim 1, further comprising exposing a pad part of the metal wirings after forming the third isolation layer.

3. The method of claim 1, wherein forming the first to third isolation layers comprises a chemical vapor deposition technique or spin coating technique.

4. The method of claim 3, wherein forming a first one of the first to third color filters comprises a blue color filter, a second one of the first to third color filters comprises a red color filter, and a third one of the first to third color filters comprises a green color filter.

5. The method of claim 4, wherein the first color filter comprises a blue color filter, the second color filter comprises a red color filter, and the third color filter comprises a green color filter.

6. The method of claim 1, further comprising forming a field oxide layer and a transistor gate electrode on the substrate.

7. The method of claim 6, wherein the substrate comprises a semiconductor substrate.

8. The method of claim 1, wherein each of the first to third isolation layers independently comprises a thermal oxide layer, a silicon nitride layer, a TEOS layer, a silicon oxide layer, or a silicon oxide nitride layer.

9. The method of claim 1, wherein each or the first to third isolation layers independently has a thickness in a range of 50–3000 Å.

10. The method of claim 1, wherein the first isolation layer is formed such that it is between the first color filter and the second color filter.

11. A method for manufacturing a CMOS image sensor comprising:
   forming an interlayer dielectric layer on a substrate having a light receiving region;

forming a plurality of metal wirings so as to expose the light receiving region on the interlayer dielectric layer between the metal wirings;

forming a protection layer on the metal wirings and the interlayer dielectric layer;

forming a first color filter an the protection layer;

forming a first isolation layer on the first color filter and the protection layer;

forming a second color filter on the first isolation layer;

forming a third color filter on the first isolation layer; and forming a second isolation layer on the second color filter, the third color filter, and the first isolation layer.

12. The method of claim 11, further comprising exposing a pad part of the metal wirings after forming the second isolation layer.

13. The method of claim 11, wherein forming each of the first and second isolation layers comprises a chemical vapor deposition technique or spin coating technique.

14. The method of claim 11, wherein forming a first one of the first to third color filters comprises a blue color filter, a second one of the first to third color filters comprises a red color filter, and a third one of the first to third color filters comprises a green color filter.

15. The method of claim 14, wherein the first color filter comprises a blue color filter, the second color filter layer comprises a red color filter, and the third color filter comprises a green color filter.

16. The method of claim 11, further comprising forming a field oxide layer and a transistor gate electrode on the substrate.

17. The method of claim 16, wherein the substrate comprises a semiconductor substrate.

18. The method of claim 11, wherein each of the first and second isolation layers independently comprises a thermal oxide layer, a silicon nitride layer, a TEOS layer, a silicon oxide layer, or a silicon oxide nitride layer.

19. The method of claim 11, wherein each of the first and second isolation layers independently has a thickness in a range of 50~3000 Å.

20. The method of claim 11, wherein the first isolation layer is formed such that it is between the first color filter and each of the second and third color filters.

* * * * *